United States Patent
Lee et al.

(10) Patent No.: US 8,535,564 B2
(45) Date of Patent: Sep. 17, 2013

(54) LIGHT EMITTING DEVICE EMPLOYING LUMINESCENT SUBSTANCES WITH OXYORTHOSILICATE LUMINOPHORES

(75) Inventors: Chung Hoon Lee, Ansan-si (KR); Walter Tews, Greifswald (DE); Gundula Roth, Levenhagen (DE); Detlef Starick, Greifswald (DE)

(73) Assignee: Seoul Semiconductor, Co., Ltd., Seoul (KR)

( * ) Notice: Subject to any disclaimer, the term of this patent is extended or adjusted under 35 U.S.C. 154(b) by 582 days.

(21) Appl. No.: 12/767,253

(22) Filed: Apr. 26, 2010

(65) Prior Publication Data
US 2011/0050090 A1    Mar. 3, 2011

(30) Foreign Application Priority Data

Jun. 24, 2009 (DE) .................. 10 2009 030 205
Sep. 1, 2009 (KR) .................. 10-2009-0081949

(51) Int. Cl.
*C09K 11/08* (2006.01)
*C09K 11/59* (2006.01)

(52) U.S. Cl.
USPC .............................. 252/301.4 F; 252/301.6 F (58) Field of Classification Search
USPC ...... 252/301.4 F, 301.6 R, 301.6 F; 313/483, 313/486, 503, 504
See application file for complete search history.

(56) References Cited

U.S. PATENT DOCUMENTS

| | | | |
|---|---|---|---|
| 2,110,162 A | 3/1938 | Leverenz | |
| 2,402,760 A | 6/1946 | Leverenz | |
| 2,570,136 A | 10/1951 | Lyon | |
| 2,617,773 A | 11/1952 | Nagy et al. | |
| 2,719,128 A | 9/1955 | Kressin | |
| 2,780,600 A | 2/1957 | Wollentin | |
| 3,143,510 A | 8/1964 | Wanmaker et al. | |

(Continued)

FOREIGN PATENT DOCUMENTS

| AT | 410266 | 3/2003 |
|---|---|---|
| CN | 1218084 | 6/1999 |

(Continued)

OTHER PUBLICATIONS

Feldmann C., "Inorganic Luminescent Materials: 100 Years of Research and Application", Adv. Funct. Matter, 2003, pp. 511-516.

(Continued)

*Primary Examiner* — Emily Le
*Assistant Examiner* — Lynne Edmondson
(74) *Attorney, Agent, or Firm* — H.C. Park & Associates, PLC (57) ABSTRACT

A light emitting device having oxyorthosilicate luminophores is disclosed. The light emitting device includes a light emitting diode and luminescent substances disposed around the light emitting diode, to absorb at least a portion of light emitted from the light emitting diode and emitting light having different wavelength from that of the absorbed light. The luminescent substances have $Eu^{2+}$-doped silicate luminophores in which solid solutions in the form of mixed phases between alkaline earth metal oxyorthosilicates and rare earth metal oxyorthosilicates are used as base lattices for the $Eu^{2+}$ activation leading to luminescence. The luminescent substances are used as radiation converters to convert a higher-energy primary radiation, for example, ultra violet (UV) radiation or blue light, into a longer-wave visible radiation and are therefore preferably employed in corresponding light-emitting devices.

20 Claims, 4 Drawing Sheets

(56) References Cited

U.S. PATENT DOCUMENTS

| | | |
|---|---|---|
| 3,598,752 A | 8/1971 | Sisneros |
| 3,644,212 A | 2/1972 | McAllister et al. |
| 3,893,939 A | 7/1975 | De Kalb et al. |
| 3,905,911 A | 9/1975 | Kelsey, Jr. et al. |
| 4,215,289 A | 7/1980 | De Hair et al. |
| 4,770,950 A | 9/1988 | Ohnishi |
| 4,972,086 A | 11/1990 | Bryan et al. |
| 5,032,316 A | 7/1991 | Takahashi et al. |
| 5,433,295 A | 7/1995 | Murphy |
| 5,472,636 A | 12/1995 | Forster et al. |
| 5,518,808 A | 5/1996 | Bruno et al. |
| 5,770,110 A | 6/1998 | Schrell et al. |
| 5,770,111 A | 6/1998 | Moriyama et al. |
| 5,853,614 A | 12/1998 | Hao et al. |
| 5,952,681 A | 9/1999 | Chen |
| 5,965,192 A | 10/1999 | Potter |
| 5,998,925 A | 12/1999 | Shimizu et al. |
| 6,045,722 A | 4/2000 | Leblans et al. |
| 6,066,861 A | 5/2000 | Hohn et al. |
| 6,373,184 B1 | 4/2002 | Suh et al. |
| 6,472,765 B1 | 10/2002 | Sano et al. |
| 6,482,664 B1 | 11/2002 | Lee et al. |
| 6,565,771 B1 | 5/2003 | Ono et al. |
| 6,670,751 B2 | 12/2003 | Song et al. |
| 6,686,691 B1 | 2/2004 | Mueller et al. |
| 6,842,664 B2 | 1/2005 | Harada et al. |
| 6,982,045 B2 | 1/2006 | Menkara et al. |
| 6,982,048 B1 | 1/2006 | Atwater et al. |
| 6,987,353 B2 | 1/2006 | Menkara et al. |
| 7,019,335 B2 | 3/2006 | Suenaga |
| 7,029,602 B2 | 4/2006 | Oshio |
| 7,045,078 B2 | 5/2006 | Choi |
| 7,138,770 B2 | 11/2006 | Uang et al. |
| 7,189,340 B2 | 3/2007 | Shimomura et al. |
| 7,206,507 B2 | 4/2007 | Lee et al. |
| 7,229,571 B2 | 6/2007 | Ezuhara et al. |
| 7,244,965 B2 | 7/2007 | Andrews et al. |
| 7,332,746 B1 | 2/2008 | Takahashi et al. |
| 7,468,147 B2 | 12/2008 | Shida et al. |
| 7,554,129 B2 | 6/2009 | Roth et al. |
| 7,608,200 B2 | 10/2009 | Seto et al. |
| 7,679,101 B2 | 3/2010 | Ota et al. |
| 7,679,281 B2 | 3/2010 | Kim et al. |
| 2002/0015013 A1 | 2/2002 | Ragle |
| 2003/0038295 A1 | 2/2003 | Koda |
| 2003/0168636 A1 | 9/2003 | Dobson et al. |
| 2004/0051111 A1 | 3/2004 | Ota et al. |
| 2004/0104391 A1 | 6/2004 | Maeda et al. |
| 2004/0136891 A1 | 7/2004 | Kijima et al. |
| 2004/0206970 A1 | 10/2004 | Martin |
| 2004/0251809 A1 | 12/2004 | Shimomura et al. |
| 2005/0001537 A1 | 1/2005 | West et al. |
| 2005/0029927 A1 | 2/2005 | Setlur et al. |
| 2005/0117334 A1 | 6/2005 | Lee et al. |
| 2005/0139846 A1 | 6/2005 | Park et al. |
| 2005/0141048 A1 | 6/2005 | Mizutani |
| 2005/0239227 A1 | 10/2005 | Aanegola et al. |
| 2005/0264161 A1 | 12/2005 | Oaku et al. |
| 2005/0274930 A1 | 12/2005 | Roth et al. |
| 2005/0274972 A1 | 12/2005 | Roth et al. |
| 2006/0076883 A1 | 4/2006 | Himaki et al. |
| 2006/0158090 A1 | 7/2006 | Wang et al. |
| 2006/0261309 A1 | 11/2006 | Li et al. |
| 2006/0261350 A1 | 11/2006 | Kawazoe et al. |
| 2006/0267042 A1 | 11/2006 | Izuno et al. |
| 2007/0029526 A1 | 2/2007 | Cheng et al. |
| 2007/0247051 A1 | 10/2007 | Kuze et al. |
| 2007/0284563 A1 | 12/2007 | Lee et al. |
| 2008/0067472 A1 | 3/2008 | Roth et al. |
| 2008/0067920 A1 | 3/2008 | Roth et al. |
| 2008/0224163 A1 | 9/2008 | Roth et al. |
| 2009/0050847 A1 | 2/2009 | Xu et al. |
| 2009/0050849 A1 | 2/2009 | Lee et al. |
| 2009/0134413 A1 | 5/2009 | Roth et al. |
| 2009/0152496 A1 | 6/2009 | Roth et al. |
| 2009/0262515 A1* | 10/2009 | Lee et al. .......... 362/84 |
| 2009/0303694 A1 | 12/2009 | Roth et al. |
| 2010/0002454 A1 | 1/2010 | Lee et al. |
| 2010/0096974 A1* | 4/2010 | Setlur et al. ........ 313/487 |
| 2010/0165645 A1 | 7/2010 | Lee et al. |
| 2010/0207132 A1 | 8/2010 | Lee et al. |

FOREIGN PATENT DOCUMENTS

| | | |
|---|---|---|
| CN | 1289454 | 3/2001 |
| CN | 1317537 | 10/2001 |
| CN | 1344777 | 4/2002 |
| CN | 1434521 | 8/2003 |
| CN | 1707819 | 12/2005 |
| DE | 10233050 | 2/2004 |
| DE | 10259946 | 7/2004 |
| EP | 0094132 | 11/1983 |
| EP | 0382295 | 8/1993 |
| EP | 0862794 | 9/1998 |
| EP | 0896994 | 2/1999 |
| EP | 1249873 | 10/2002 |
| EP | 1605030 | 12/2005 |
| EP | 2031038 | 3/2009 |
| GB | 1336053 | 11/1973 |
| GB | 2016034 | 9/1979 |
| JP | 31-1118 | 2/1956 |
| JP | 33-8177 | 9/1958 |
| JP | 38-6082 | 5/1963 |
| JP | 39-8803 | 5/1964 |
| JP | 47-6258 | 4/1972 |
| JP | 49-38994 | 10/1974 |
| JP | 55-135190 | 10/1980 |
| JP | 57-109886 | 7/1982 |
| JP | 61-258892 | 11/1986 |
| JP | 62-197487 | 9/1987 |
| JP | 5-78659 | 3/1993 |
| JP | 9-40946 | 2/1997 |
| JP | 9-153644 | 6/1997 |
| JP | 2001-308393 | 11/2001 |
| JP | 2002-50795 | 2/2002 |
| JP | 2002-057376 | 2/2002 |
| JP | 2002-094122 | 3/2002 |
| JP | 2002-97465 | 4/2002 |
| JP | 2002-97466 | 4/2002 |
| JP | 2002-173677 | 6/2002 |
| JP | 2002-335019 | 11/2002 |
| JP | 2002-359403 | 12/2002 |
| JP | 2002-368277 | 12/2002 |
| JP | 2003-064358 | 3/2003 |
| JP | 2003-152229 | 5/2003 |
| JP | 2003-183649 | 7/2003 |
| JP | 2003-224306 | 8/2003 |
| JP | 2003-321675 | 11/2003 |
| JP | 2004-006582 | 1/2004 |
| JP | 2004-010786 | 1/2004 |
| JP | 2004-505470 | 2/2004 |
| JP | 2004-071726 | 3/2004 |
| JP | 2004-71807 | 3/2004 |
| JP | 2004-127988 | 4/2004 |
| JP | 2004-134699 | 4/2004 |
| JP | 2004-192833 | 7/2004 |
| JP | 2001-115157 | 12/2004 |
| JP | 2005-167177 | 6/2005 |
| JP | 2006-073656 | 3/2006 |
| JP | 2006-173433 | 6/2006 |
| JP | 2007-186674 | 7/2007 |
| KR | 10-232395 | 12/1999 |
| KR | 10-2001-0032450 | 4/2001 |
| KR | 10-2001-0050839 | 6/2001 |
| KR | 10-2001-0101910 | 11/2001 |
| KR | 10-2002-0000835 | 1/2002 |
| KR | 10-2002-0053975 | 7/2002 |
| KR | 10-0392363 | 7/2002 |
| KR | 10-2002-0079513 | 10/2002 |
| KR | 10-2003-0063211 | 7/2003 |
| KR | 10-2003-0082395 | 10/2003 |
| KR | 10-0426034 | 7/2004 |
| KR | 10-2004-0088418 | 10/2004 |
| KR | 10-2005-0008426 | 1/2005 |
| KR | 10-2005-0070349 | 7/2005 |

| | | |
|---|---|---|
| KR | 10-2005-0098462 | 10/2005 |
| KR | 10-2005-0106945 | 11/2005 |
| KR | 10-2005-0117164 | 12/2005 |
| KR | 10-2005-0117165 | 12/2005 |
| KR | 10-2006-0034056 | 4/2006 |
| KR | 10-0626272 | 9/2006 |
| KR | 10-2006-0134728 | 12/2006 |
| KR | 10-2007-0064275 | 6/2007 |
| KR | 10-2007-0084659 | 8/2007 |
| KR | 10-2007-0086483 | 8/2007 |
| KR | 10-2007-0098194 | 10/2007 |
| KR | 10-2008-0046789 | 5/2008 |
| KR | 10-2008-0074241 | 7/2008 |
| KR | 10-2008-0075181 | 7/2008 |
| TW | 1328885 | 3/1999 |
| WO | 96-32457 | 10/1996 |
| WO | 98-05078 | 2/1998 |
| WO | 98-12757 | 3/1998 |
| WO | 98-39805 | 9/1998 |
| WO | 98-42798 | 10/1998 |
| WO | 00-19546 | 4/2000 |
| WO | 01-41215 | 6/2001 |
| WO | 02-054502 | 7/2002 |
| WO | 02-054503 | 7/2002 |
| WO | 02-089219 | 11/2002 |
| WO | 03-021691 | 3/2003 |
| WO | 2004-085570 | 10/2004 |
| WO | 2004-111156 | 12/2004 |
| WO | 2005-068584 | 7/2005 |
| WO | 2005-112137 | 11/2005 |
| WO | 2005109532 | 11/2005 |
| WO | 2006-043682 | 4/2006 |
| WO | 2006-068359 | 6/2006 |
| WO | 2006-081803 | 8/2006 |
| WO | 2006/109659 | 10/2006 |
| WO | 2007-035026 | 3/2007 |
| WO | 2007-055538 | 5/2007 |
| WO | 2007-069869 | 6/2007 |
| WO | 2007-114614 | 11/2007 |
| WO | 2009028818 | 3/2009 |

OTHER PUBLICATIONS

G. Blasse, B.C. Grabmeier, "Luminescent Materials", Springer, 1994, 87-90.
B. Cordero, V. Gómez, A. E. Platero-Prats, M. Revés, J. Echeverria, E. Cremades, F. Barragán, and S. Alvarez, "Covalent radii revisted", Dalton Trans., (2008), pp. 2832-2838.
R.J. Angel et al., "Structure and twinning of single-crystal MgSiO3 garnet synthisized at 17 GPa and 1800 °C", American Minerologist, 74 (1989) pp. 509-512.
P.A. Cox, "Transition Metal Oxides", Oxford University Press, 1995, p. 105.
Garcia Solé, L.E. Bausá, D. Jaque, "An Introduction to the Optical Spectroscopy of Inorganic Solids", Wiley, 2005, pp. 163-164.
G. Blasse, B.C. Grabmeier, "Luminescent Materials", Springer, 1994, p. 25.
S. Shionoya, W.M. Yen, "Phospher Handbook" CRC press, 1999, ch. 3.3, pp. 183-184.
Garcia Solé, L.E. Bausá, D. Jaque, "An Introduction to the Optical Spectroscopy of Inorganic Solids", Wiley, 2005, pp. 132-133.
S. Shionoya, W.M. Yen, "Phosphor Handbook" CRC press, 1999, ch. 3.3, pp. 179-182.
G. Blasse, A. Bril, "Characteristic Luminescence", Philips Technical Review, 31 (1970) 304, p. 310.
G. Blasse, A. Bril, "Characteristic Luminescence", Philips Technical Review, 31 (1970) 304, p. 306.
G. Blasse, B.C. Grabmeier, "Luminescent Materials", Springer, 1994, pp. 40-47.
International Search Report for PCT/KR2010/003302 issued on Jan. 3, 2011, corresponding to U.S. Appl. No. 12/767,253.
Final Office Action dated Dec. 8, 2010 in U.S. Appl. No. 11/948,813.
Final Office Action dated Dec. 23, 2010 in U.S. Appl. No. 11/569,060.
Non Final Office Action dated Dec. 29, 2010 in U.S. Appl. No. 12/731,811.
Final Office Action dated Dec. 7, 2010 in U.S. Appl. No. 11/948,845.
Non Final Office Action dated Nov. 26, 2010 in U.S. Appl. No. 12/440,001.
Non Final Office Action dated Nov. 24, 2010 in U.S. Appl. No. 12/093,441.
Final Office Action dated Nov. 30, 2010 in U.S. Appl. No. 11/024,722.
Non Final Office Action dated Nov. 30, 2010 in U.S. Appl. No. 12/196,923.
Notice of Allowance dated Aug. 18, 2010 in U.S. Appl. No. 12/098,263.
Final Office Action dated May 11, 2010 in U.S. Appl. No. 12/098,263.
Non Final Office Action dated Mar. 17, 2010 in U.S. Appl. No. 11/024,722.
Non Final Office Action dated Aug. 17, 2010 in U.S. Appl. No. 11/948,845.
Ep Search Report dated Sep. 1, 2010 in EP Appl No. 08015119 corresponding to U.S. Appl. No. 12/440,001.
EP Search Report dated Oct. 6, 2010 in EP Appl No. 07745750.5—corresponding to U.S. Appl. No. 12/295,438.
Non Final Office Action dated Jun. 16, 2010 in U.S. Appl. No. 12/097,741.
Final Office Action dated Nov. 12, 2010 in U.S. Appl. No. 12/097,741.
Non-Final Office Action dated Aug. 10, 2010 in U.S. Appl. No. 11/024,722.
Final Office Action dated Jun. 21, 2010 in U.S. Appl. No. 11/569,060.
Non-Final Office Action dated Apr. 30, 2010 in U.S. Appl. No. 11/568,769.
Final Office Action dated Sep. 9, 2010 in U.S. Appl. No. 11/568,769.
CN Office Action dated Feb. 5, 2010 in CN Appl. No. 2005100023042.
European Search Report of Oct. 26, 2010 in EP 10 17 7817, corresponding to U.S. Appl. No. 11/024,722.
Non-Final Office Action dated Aug. 18, 2010 in U.S. Appl. No. 11/948,813.
Non-Final Office Action dated Aug. 10, 2010 in U.S. Appl. No. 12/731,811.
IP Australia Office Action dated Jul. 2, 2010 for AU Patent Appl. No. 2005-319965, corresponding to U.S. Appl. No. 12/098,263.
TW Office Action of Sep. 10, 2010 in TW Patent Appl. No. 098123458.
European Search Report of Sep. 23, 2010 in European Patent Appl. No. 10 16 4970.
Non-final office action dated May 29, 2009 issued in U.S. Appl. No. 11/024,722, filed Dec. 30, 2004.
Notice of Allowance dated May 4, 2009 issued in U.S. Appl. No. 11/024,702.
Non-final office action dated Nov. 29, 2007 issued in U.S. Appl. No. 11/024,702, filed Dec. 30, 2004.
Non-final office action dated Aug. 12, 2009 issued in U.S. Appl. No. 11/569,060, filed Jun. 22, 2007.
Non-final office action dated Jan. 13, 2010 issued in U.S. Appl. No. 11/569,060, filed Jun. 22, 2007.
Non-final office action dated Nov. 17, 2009 issued in U.S. Appl. No. 12/097,741, filed Oct. 9, 2008.
Final office action dated Feb. 7, 2007 issued in U.S. Appl. No. 11/024,702, filed Dec. 30, 2004.
Non-final office action dated Jun. 22, 2006 issued in U.S. Appl. No. 11/024,702, filed Dec. 30, 2004.
Non-final office action dated Nov. 29, 2006 issued in U.S. Appl. No. 11/024,722, filed Dec. 30, 2004.
Final office action dated Oct. 28, 2009 issued in U.S. Appl. No. 11/024,722, filed Dec. 30, 2004.
Non-final office action dated May 23, 2007 issued in U.S. Appl. No. 11/024,722, filed Dec. 30, 2004.
Non-final office action dated Nov. 14, 2008 issued in U.S. Appl. No. 11/024,722, filed Dec. 30, 2004.
Non-final office action dated Nov. 2, 2009 issued in U.S. Appl. No. 12/098,263.
Ralchenko, Yu., Kramida, A.E., Reader, J. And NIST ASD Team (2008). NIST Atomic Spectra Database (version 3.1.5), [Online].

Available: http://physics.nist.gov/asd3 [Feb. 27, 2009]. National Institute of Standards and Technology, Gaithersburg, MD.
N. S. Akhmetov, "Inorganic Chemistry", Moscow "Vysshaya Shkola", 1975; (partial translation; translated pp. 332-333, 372-373, 384-385, 427, 432, 436, 445, 471, 476, 486, 491, 496-497, 501, 546-549).
Markovsky L, Ya. Et al., Phosphors (Moscow-Leningrad, Khimiya Publishers, 1966, p. 7 (partial translation).
Search Report dated Apr. 11, 2006 for EP Application No. EP04106880.0.
Search Report dated Nov. 5, 2008 for EP Application No. EP06812549.1.
Search Report dated Aug. 21, 2007 for EP Application No. EP04106882.6.
Indian Office Action of Indian Application No. 2468/KOLNP/2007 issued on Jan. 28, 2011, corresponding to U.S. Appl. No. 12/098,263.
International Search Report dated Jul. 12, 2007 for PCT Application No. PCT/KR2007/001587.
International Search Report dated Mar. 21, 2007 for PCT Application No. PCT/KR2006/005500.
International Search Report dated Feb. 20, 2007 for PCT Application No. PCT/KR2006/004716.
International Search Report dated Oct. 24, 2005 for PCT Application No. PCT/KR2005/002332.
International Search Report dated Oct. 13, 2005 for PCT Application No. PCT/KR2005/002333.
International Search Report dated Aug. 12, 2005 for PCT Application No. PCT/KR2005/001288.
International Search Report dated Aug. 12, 2005 for PCT Application No. PCT/KR2005/001287.
International Search Report dated Feb. 27, 2009 for PCT Application No. PCT/KR2008/004734.
International Search Report dated Feb. 11, 2009 for PCT Application No. PCT/KR2008/004733.
Joung Kyu Park, et al., "Silicate Phosphors for White LEDs Identified Through Combinatorial Chemistry", Electrochemical and Solid-State Letters, vol. 10(2), pp. J15-J18, (2007), XP-00251106706-11-12).
Joung Kyu Park, et al., "Luminescence Characteristics of Yellow Emitting $Ba_3SiO_5$:$EU^{2+}$ Phosphor", Journal of Materials Science 40 (2005), pp. 2069-2071, XP-002511068.
Search Report dated Feb. 2, 2009 for EP Application No. EP08014684.
S.D. Jee, et al., "Photoluminescence properties of $Eu^{2+}$-activated $Sr_3SiO_5$ Phosphors," J. Mater Sci. 41 (2006), pp. 3139-3141.
G. Blasse, et al., "Fluorescence of Europium2+-activated silicates," Philips Res. Repts 23 (1968), pp. 189-199.
G. Roth, et al. "Advanced Silicate Phosphors for improved white LED", Global Phosphor Summit Seoul/Korea, Mar. 5-7, 2007.
H.G. Kang, et al., "Embodiment and Luminescence Properties of $Sr_3SiO_5$:Eu(yellow-orange phosphor) by co-doping lanthanide", Solid State Phenomena, vol. 124-126 (2007) pp. 511-514.
T.L. Barry, "Fluorescence of $Eu^{2+}$ Activated Phases in Binary Alkaline Earth Orthosilicate Systems", J. Electrochem Soc., Nov. 1968, pp. 1181-1184.
Notice of Allowance dated Dec. 1, 2008 issued in U.S. Appl. No. 11/024,702.
Chinese Office Action corresponding to Patent App No. 2005800150173 dated Dec. 28, 2007.
Final OA dated Oct. 22, 2007 issued in U.S. Appl. No. 11/024,722.
Office Action dated Dec. 28, 2007 corresponding to China App No. 200580016844.4.
X. W. Sun et al., "Pulsed Laser Deposition of Silicate Phosphor Thin Films", Appl. Phys. A 69, 1999, 5 pp.
W.L. Wanmaker et al. "Luminescence of Phosphors Based on the Host Lattice $ABGe_2O_6$ (A, B=Ca, Sr, Ba)" Journal of Solid State Chemistry 3, (1971), pp. 194-196.

Declaration under 37 CFR 1.132 dated Aug. 24, 2007.
Non-Final OA mailed May 23, 2007 for U.S. Appl. No. 11/024,722 entitled "Luminescent Material".
Ageeth A. Bol et al., "Luminescence of ZnS:$Cu^{2+}$", Journal of Luminescence, No. 99, 2002, pp. 325-334.
J.F. Suyver et al., "Luminescence of nanocrystalline ZnSe:Cu", Applied Physics Letters, vol. 79, No. 25, Dec. 17, 2001, pp. 4222-4224.
Ping Yang et al., "Photoluminescence of $Cu+$-doped and $Cu^{2+}$-doped ZnS nanocrystallites", Journal of Physics and Chemistry of Solids, No. 63, 2002, pp. 638-643.
S. Shionoya et al., (Eds.), "Principal phosphor materials and their optical properties" in Phosphor Handbook, CRC Press, 1999, pp. 231-255.
A. Scacco et al., "Optical Spectra of $Cu^{2°}$ Ions in LiF Crystals", Radiation Effects and Defects in Solids, vol. 134, 1995, pp. 333-336.
Lujcan Dubicki et al., "The First d-d Fluorescence of a Six-Coordinate Copper (II) Ion", J. Am. Chem. Soc. 1989, No. 111, pp. 3452, 3454.
A.B.P. Lever, "Inorganic Electronic Spectroscopy", 2nd ed., Elsevier, 1984, pp. 355 and 557-559.
A.G. Shenstone, "The Third Spectrum of Copper (Cu III)", Journal of Research of the National Bureau of Standards—A. Physics and Chemistry, vol. 79A, No. 3, May-Jun. 1975, pp. 497-521.
S. Shinoya et al. (Eds.), "Principal phosphor materials and their optical properties" in Phosphor Handbook, CRC Press, 1999, p. 836.
First Office Action of the PRC to Chinese Patent App No. 20051002304.2 dated Feb. 15, 2008.
Yang, "Up- Conversion Fluorescence in $Er3 + Yb3 +$ Co- Doped Oxy—Fluoride Compound Materials Based on $GeO2$", Natural Science Journal of Xiangtan University, vol. 23, No. 2, 2001, pp. 37-41.
Bernhardt, Investigations of the Orange Luminescence of $PbMo04$ Crystals, Phys. Stat. Sol (a), 91, 643, 1985, pp. 643-647.
Butler, "Fluorescent Lamp Phosphors", The Pennsylvania State University Press, 1980, pp. 175-176.
Butler, "Fluorescent Lamp Phosphors", The Pennsylvania State University Press, 1980, pp. 181-182.
Butler, "Fluorescent Lamp Phosphors", The Pennsylvania State University Press, 1980, pp. 281-284.
"Phosphors for Mercury Lamps" https:/www.lamptech.co.uk/Docuemnts/M14%20Phosphors.htm 2003 (2 pages).
Blasse, "Radiationless Processes in Luminescent Materials", Radiationless Processes, 1980, pp. 287-289, 293.
Shinonoya, "Phosphor Handbook", edited under the auspice of Phosphor Research Society, CRC Press, 1999, pp. 204-205.
Shinonoya, "Phosphor Handbook", edited under the auspice of Phosphor Research Society, CRC Press, 1999, p. 238-239, 241.
van Gool, "Philips Res. Rept. Suppl." 3, 1, 1961, pp. 1-9, 30-51, 84-85.
Declaration Under Rule 37 CFR 1.132 of Ulrich Kynast dated Sep. 6, 2008.
G. Blasse, "Characteristic Luminescence", Philips Technical Review, vol. 31, 1970, pp. 304-332.
R. Chen, et al., "Developments in Luminescence and Display Materials Over the Last 100 Years as Reflected in Electrochemical Society Publications", Journal of the Electrochemical Society, vol. 149 No. 9, pp. 69-78 (2002).
G.L. Miessler & D.A. Tarr, "Inorganic Chemistry", 3rd ed., Pearson / Prentice Hall, New Jersey, pp. 117-118 (2004).
Wanmaker, et al., "Luminescence of Copper-Activated Orthophosphates of the Type ABPO (A=Ca, Sr, or Ba and B=Li, Na or K)", Journal of the Electrochemical Society, vol. 109, No. 2, pp. 109-113 (Feb. 1962).
Wanmaker, et al., "Luminescence of Copper-Activated Calcium and Strontium Orthophosphates", Journal of the Electrochemical Society, vol. 106, No. 12, pp. 1027-1031 (Dec. 1959).

\* cited by examiner

LIGHT EMITTING DEVICE EMPLOYING LUMINESCENT SUBSTANCES WITH OXYORTHOSILICATE LUMINOPHORES

CROSS-REFERENCE TO RELATED APPLICATIONS

This application claims priority from and the benefit of German Patent Application No. 10-2009-030 205.0, filed on Jun. 24, 2009 and Korean Patent Application No. 10-2009-0081949, filed on Sep. 1, 2009, which are hereby incorporated by reference for all purposes as if fully set forth herein.

BACKGROUND OF THE INVENTION

1. Field of the Invention

Exemplary embodiments of the invention relate to a light emitting device employing inorganic silicate-based luminescent substances as a radiation converter. The light emitting device can emit colored or white light by employing the luminescent substances, which can be used as a radiation converter for converting higher-energy primary radiation, for example ultra violet (UV) radiation or blue light, into a longer-wave visible radiation. The light emitting device comprising the luminescent conversion substances can be distinguished in particular for an improved temperature-dependent efficiency of the luminescence or quantum efficiency and for a longer life of the luminescent substances which can be responsible for the emission of the light produced. In particular, a high stability of the luminophores with respect to the radiation load occurring and with respect to the influence of atmospheric humidity and other environmental factors can be achieved.

2. Description of the Background

A light emitting device (LED) has been widely used for various applications, for example, indicators, display boards and display devices ever since the light emitting device can implement colors. White light can also has an applicability for general illumination. Since such a light emitting device provides high efficiency and long life span and is ecological, this has spawned the light emitting device to continuously develop for many applications.

To promote greater adoption, manufacturers effort to develop various methods for implementing colors including white light and techniques to dispose phosphors around a light emitting diode and to combine light emitted from the light emitting diode and light emitted from the phosphors is generally accepted to implement white light.

For example, europium-activated alkaline earth metal oxyorthosilicates of the general type $Sr_3SiO_5$:Eu have become known for use in LEDs emitting colored or white light, it also being possible completely or partly to replace the element strontium in these compounds by other alkaline earth metal ions.

However, acknowledged disadvantage of luminescent substances is that they have a comparatively short life under conditions of use. This is due in particular under the high moisture sensitivity of the europium-doped alkaline earth metal oxyorthosilicates.

Therefore, there is a need for an approach for reducing a substantial disadvantage which may cause completely prevent a technical applicability of the luminophores or at least limit the disadvantages to a considerable extent.

SUMMARY OF THE INVENTION

These and other needs are addressed by the present invention, in which exemplary embodiments of the invention provide light emitting devices including chemically modified oxyorthosilicate luminescent substances having improved properties, in particular having a substantially increased stability to atmospheric humidity.

Additional features of the invention will be set forth in the description which follows, and in part will be apparent from the description, or may be learned by practice of the invention.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

Exemplary embodiments of the present invention disclose a light emitting device. The device includes a light emitting diode. The device also includes luminescent substances disposed around the light emitting diode to absorb at least a portion of light emitted from the light emitting diode. The light emitted from the light emitting diode has different wavelength from that of the absorbed light. The luminescent substances comprise $Eu^{2+}$- doped silicate luminophores to form mixed phases between alkaline earth metal oxyorthosilicates and rare earth metal oxyorthosilicates used as base lattices for the $Eu^{2+}$ activation leading to luminescence.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

A light emitting device employing luminescent substances including chemically modified oxyorthosilicate luminescent substances is described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1:
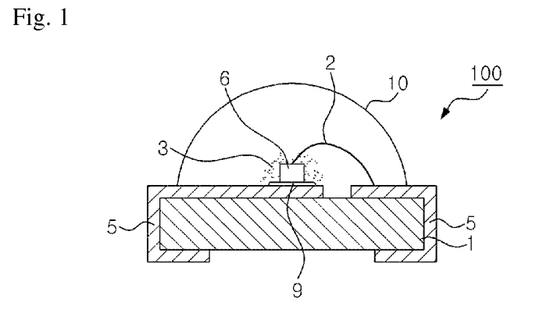
FIG. 1 is a cross-sectional view of a light emitting device 100 according to exemplary embodiments of the present invention.

FIG. 1 is a cross-sectional view of a light emitting device 100 according to exemplary embodiments of the present invention. FIG. 1 shows a chip-type package comprising at least one light emitting diode and luminescent substances.

Referring to FIG. 1, electrodes 5 may be formed on both sides of substrate 1. Light emitting diode 6 emitting primary light may be mounted on one of the electrodes 5. The light emitting diode 6 may be mounted on one electrode 5 via electrically conductive paste 9, such as Ag paste, and be connected to other electrode 5 via, for example, an electrically conductive wire 2.

The light emitting diode 6 may emit ultraviolet or blue light and can be fabricated of gallium nitride based composite semiconductor. Especially, the light emitting diode 6 may emit blue light.

Luminescent substances 3 may be placed on a portion of the top and side faces of the light emitting diode 6. And, the light emitting diode 6 may be sealed with a molding member 10, for example, thermosetting resin. The luminescent substances 3 may be placed near the light emitting diode 3, but can be placed any location by way of configuration. The luminescent substances 3 can also be uniformly distributed in the molding member 10.

The luminescent substances 3, while being disposed around the light emitting diode 6, can absorb at least a portion of the light emitted from the light emitting diode or emit light having a different wavelength from the absorbed light. The luminescent substances 3 can be a silicate material having $Eu^{2+}$-doped luminophores in which solid solutions, so-called mixed phases, between the alkaline earth metal oxyorthosilicates and rare earth metal oxyorthosilicates can be used as base lattices for the $Eu^{2+}$ activation leading to luminescence.

The luminescent substances 3 will be described below in detail.

Light emitting diode 6 may be electrically connected to an external power supply via electrodes 5, and thus can emit primary light. The luminescent substances 3 may absorb at least a portion of the primary light and emit secondary light of a wavelength longer than that of the primary light. As a result, the primary light emitted from the light emitting diode 6 and the secondary light from the luminescent substances 3 can be mixed together, and the mixed light can be emitted from the light emitting device. A desired color of light, for example white light, may be implemented using this mixed light.

The light emitting device 100 may comprise two or more light emitting diodes. These light emitting diodes may have same emission peaks to one another, or may have different emission peaks from one another. For example, the light emitting device 100 may comprise the same or different light emitting diodes each of which can emit ultraviolet or blue light. Furthermore, the light emitting device 100 may comprise a light emitting diode, for example, a red light emitting diode, which can emit light with a wavelength longer than the emission peak wavelength of the phosphors. Such a longer wavelength light emitting diode may be employed for improving a color rendering index of the light emitting device 100. Moreover, the light emitting device 100 may further comprise other phosphors in addition to the luminescent substances 3. The other phosphors may comprise orthosilicate phosphors, Yttrium Aluminum Garnet (YAG) based phosphors or thiogallate phosphors, but it is not limited thereto. Accordingly, a desired light of color can be achieved with proper selection of the light emitting diode 6 and phosphors.

Figure 2:
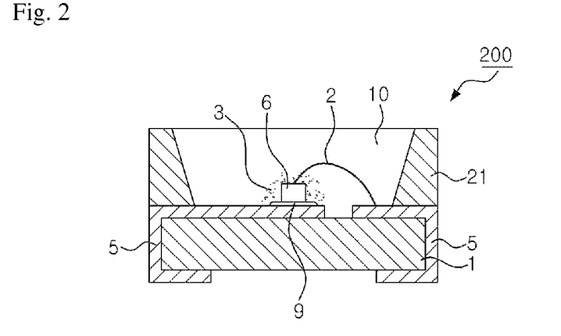
FIG. 2 is a cross-sectional view of a light emitting device 200 according to exemplary embodiments of the present invention.

FIG. 2 is a cross-sectional view of a light emitting device 200 according to exemplary embodiments of the present invention. FIG. 2 shows exemplary top-view of package having a reflector 21.

Referring to FIG. 2, the light emitting device 200 may have a similar structure as that of the above light emitting device 100, and may have a reflector 21 on the substrate 1. A light emitting diode 6 can be mounted in the reflector 21. The reflector 21 is provided to reflect light emitted from the light emitting diode 6 to increase brightness within a certain angle of view.

For example, as described with reference to FIG. 1, luminescent substances 3, while being disposed around the light emitting diode 6, may absorb at least a portion of the light emitted from the light emitting diode or emitted light having a different wavelength from the absorbed light. The luminescent substances 3 can be dotted on the light emitting diode 6 in the reflector 21 or can uniformly be distributed within a thermosetting resin molding member 10. The luminescent substances 3 will be described below in detail.

The light emitting device 200 may also comprise two or more light emitting diodes having same emission peaks to one another, or different emission peaks from one another, and may further comprise other phosphors in addition to the luminescent substances 3, as described with reference to FIG. 1.

In some examples, the light emitting device 100 or 200 as shown in the FIG. 1 or FIG. 2 can include a substrate of a metallic material, for example a metal printed circuit board (PCB,) which has good heat conductivity. Such a substrate may easily dissipate the heat from the light emitting diode 6. Furthermore, a lead frame including lead terminals may be used as the substrate. Such a leadframe may be surrounded and supported by the molding member 10 to encapsulate the light emitting diode.

As seen in FIG. 2, the reflector 21 may be formed of a different material from the substrate 1, but not limited thereto. For example, the reflector 21 may also be formed of the same material as the substrate 1. A lead frame having lead terminals can be insert-molded of a plastic, such as a polyphthalamide (PPA,) which can form the substrate 1 and the reflector 21 together. Then, the lead terminals can be bent to form electrodes 5.

Figure 3:
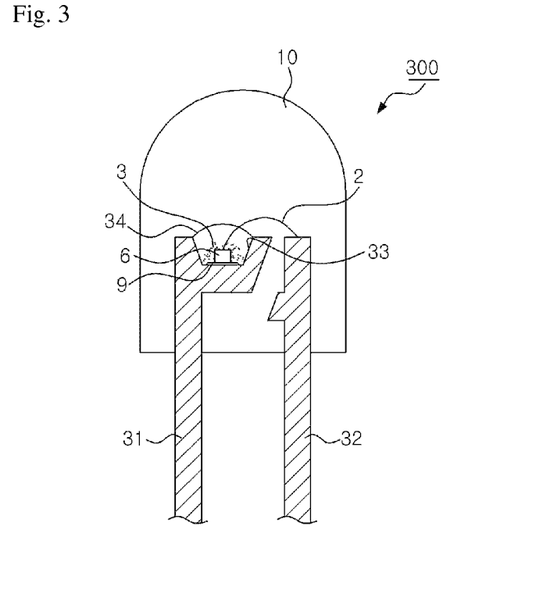
FIG. 3 is a cross-sectional view of a light emitting device 300 according to exemplary embodiments of the present invention.

FIG. 3 is a cross-sectional view of a light emitting device 300 according to exemplary embodiments of the present invention. It is contemplated that the light emitting device 300 may have been known as a light emitting diode ramp.

Referring to FIG. 3, the light emitting device 300 may have a pair of lead electrodes 31, 32, and a cup portion 33 having a shape of cup formed at a portion of the upper end of one lead electrode 31. At least one light emitting diode 6 may be mounted in the cup portion 33, and may electrically be connected to the other lead electrode 32 via a conductive wire 2. When a plurality of light emitting diodes is mounted in the cup portion 33, they may emit light of same wavelength or different wavelengths from one another.

Further, luminescent substances 3 may be disposed around the light emitting diode 6. As described with reference to FIG. 1, the luminescent substances 3, while being disposed around the light emitting diode 6, may absorb at least a portion of the light emitted from the light emitting diode and emit light having a different wavelength from that of the absorbed light. The luminescent substances 3 can be dotted on the light emitting diode 6 in the cup portion 33 or uniformly be distributed within a thermosetting resin molding member 34 formed in the cup portion 33. The luminescent substances 3 will be described below in detail.

A molding member 10 may encapsulate the light emitting diode 6, the luminescent substances, and a portion of the respective pair of lead electrodes 31 and 32. The molding member 10 may be formed of epoxy or silicone, as an example.

The light emitting device 300 may be provided to have a pair of lead electrodes 31 and 32. However, the light emitting device 300 may have more lead electrodes than the pair of lead electrodes 31 and 32.

Figure 4:
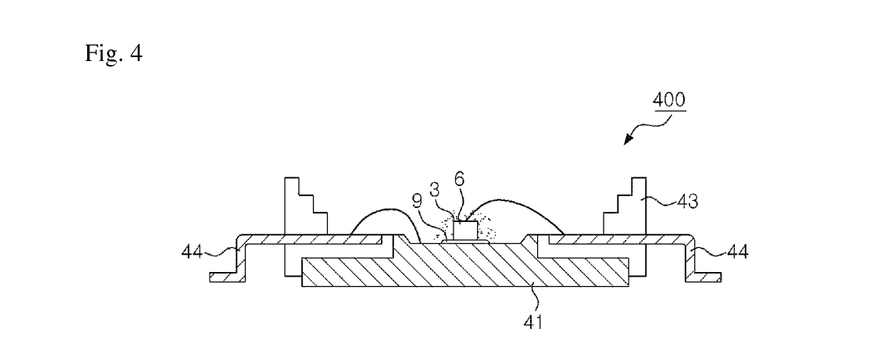
FIG. 4 is a cross-sectional view of a light emitting device 400 according to exemplary embodiments of the present invention.

FIG. 4 is a cross-sectional view of a light emitting device 400 according to exemplary embodiments of the present invention. FIG. 4 may show a light emitting diode package for high power.

Referring to FIG. 4, the light emitting device 400 may comprise a heat-sink 41 provided in a housing 43. The bottom surface of the heat sink 41 can be exposed to outside. Lead electrodes 44 can be exposed within the housing 43, and extended through the housing. At least one light emitting diode 6 can be mounted on the upper surface of the heat-sink 41 via an electrically conductive adhesive 9, and electrically be connected to one of the lead electrodes 44 via a electrically conductive wire. Furthermore, another electrically conductive wire may connect the other lead electrode 44 to the heat-sink 41, such that the light emitting diode 6 can electrically be connected to each of the two lead electrodes 44.

In some examples, luminescent substances 3 can be disposed around the light emitting diode 6 on the heat-sink 41. As described with reference to FIG. 1, the luminescent substances 3, while being disposed around the light emitting diode 6, may absorb at least a portion of the light emitted from the light emitting diode and emit light having a different wavelength from that of the absorbed light. The luminescent substances 3 can be dotted on the light emitting diode 6 on the heat-sink 41, or uniformly be distributed within a molding member (not shown) to cover the light emitting diode. The luminescent substances 3 will be described below in detail.

Figure 5:
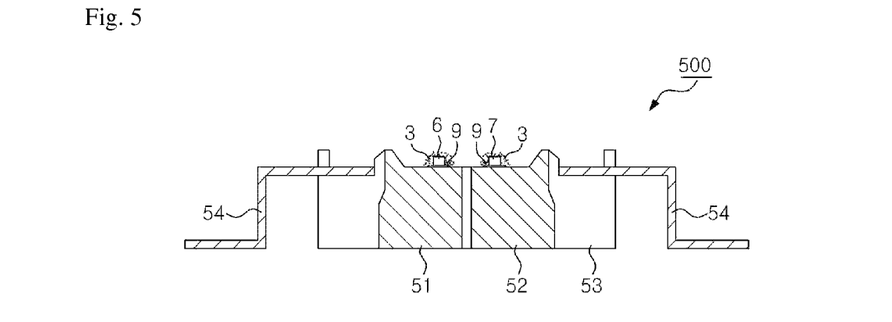
FIG. 5 is a cross-sectional view of a light emitting device 500 according to exemplary embodiments of the present invention.

FIG. 5 is a cross-sectional view of a light emitting device 500 according to exemplary embodiments of the present invention.

Referring to FIG. 5, the light emitting device 500 comprises a housing 53 and a plurality of heat-sinks 51 and 52 which can be joined to the housing and insulated from each other. Light emitting diodes 6 and 7 can be mounted on the heat-sinks 51 and 52 via electrically conductive adhesives, and electrically be connected to lead electrodes 54 via electrically conductive wires (not shown), respectively. The lead electrodes 54 can be extended from inside of the housing 53 to outside. As for the illustration only, two lead electrodes 54 are shown in FIG. 5, but more lead electrodes may be provided thereto.

For example, luminescent substances 3 may be disposed around at least one of the light emitting diodes 6 or 7, as described with reference to FIG. 4. The luminescent substances 3 will be described below in detail.

In the above embodiments of the present invention, it is contemplated that the light emitting diode 6 can be mounted on the substrate 1 or on the heat-sink via the electrically conductive adhesive 9, and electrically connected to the electrode or lead electrode via the electrically conductive wire. Those of ordinary skill in the art will recognize that embodiments may be limited when the light emitting diode 6 is a "single-bond die," which has its electrodes on the top side and bottom side thereof, respectively. It is observed that where the light emitting diode 6 is a "two-bond die", which has two electrodes on the top side thereof, the light emitting diode 6 may be electrically connected to the electrodes or lead electrodes via two electrically conductive wires, respectively. In this example, the adhesive need not to be electrically conductive.

In some examples, the light emitting diode 6 may be formed of (Al,Ga,In)N based composite semiconductor.

The light emitting diode 6 may have, for example, a double heterostructure, a single quantum well structure or multi-quantum well structures, which may have a single active region between n-type and p-type semiconductor layers.

By way of example, the light emitting diode 6 may comprise a plurality of light emitting cells spaced apart from one another on a single substrate. Each of the light emitting cells may comprise an active region, and these light emitting cells may be connected to one another in series and/or in parallel via wires such that the light emitting cells can be directly driven by an alternating current (AC) power supply. Such an AC-light emitting diode can be driven in connection to AC power supply without outer AC-DC converter by forming a bridge rectifier and a series array of light emitting cells connected to the rectifier, or by forming series arrays of light emitting cells on a single substrate, these arrays being electrically connected to one another in anti-parallel. The operating voltage of the AC-light emitting diode can be increased up to the voltage for domestic use, for example, 110V or 220V, since the light emitting cells are connected in series. As such, a light emitting device, which can be driven by domestic power supply, can be provided.

In some examples, the luminescent substances 3 may be disposed between the light emitting diode 6 and the substrate 1, the heat-sink on which the light emitting diode can be mounted, or may be distributed within the adhesive 9. These luminescent substances 3 may absorb at least a portion of the light emitted downward from the light emitting diode 6 or emitted light having a different wavelength from the absorbed light.

Although several structures for the light emitting device have been described above, the present invention may not limited these structures, and the structure of the light emitting device of the present invention can be modified based on types of the light emitting diodes, an electrical connection method thereof, a desired angle view of light, and the purpose of using the light emitting device.

Now, luminescent substances used in the embodiments of the invention are described.

This group of luminescent substances may comprise $Eu^{2+}$-doped silicate luminophores for which solid solutions, so-called mixed phases, between alkaline earth metal oxyorthosilicates and rare earth metal oxyorthosilicates can be used as base lattices. The solid solution formation, between the two different oxyorthosilicate types, can be possible within certain concentration limits and has been detected are characterized by the following notation:

$$(1-x)M^{II}_3SiO_5 \cdot xSE_2SiO_5.$$

In a general structural formula, $M^{II}$ preferably can represent the alkaline earth metal ion of Sr or represent another alkaline earth metal ion or another divalent metal ion selected from the group of the elements magnesium, calcium, barium, copper, zinc and manganese, and these ions may be used in defined amounts, as a rule, in addition to the strontium and also as mixtures with one another. In a barium case, complete replacement of the strontium can be possible. The proportion of the other divalent metal ions can be incorporated in addition to the strontium may be up to 0.5.

The symbol SE used in the general formula represents rare earth metals and designates the trivalent metal ions of yttrium, of lanthanum and of the so-called lanthanoids, i.e., —elements having atomic numbers 58 to 71, but preferably the corresponding ions of the elements yttrium, lanthanum, gadolinium and lutetium. These ions can be incorporated as individual components or as mixtures with one another into the matrix.

Apart from europium and in addition to this doping element, in principle, further divalent rare earth metal ions, for example, those of samarium, ytterbium or certain trivalent rare earth metal ions, such as, for example, cerium ions ($Ce^{3+}$) can also be used in principle as activators.

For the purpose of optimizing the luminescence properties and the stability characteristics, even further modifications may be possible based on the composition of the luminescent substances according to the invention. In some examples, the silicon can be replaced by germanium and/or by aluminium, gallium, boron or phosphorus, it may be necessary, however, to take a proper measurement for preserving the charge balance. These may consist, for example, in addition to incorporating further monovalent cations, incorporate lithium, sodium or potassium, or anions, such as fluorine, chlorine, bromine or iodine, into the base lattices.

By way of example, the luminescent substances according to the invention have the following formula:

$$(1-x)(Sr_{3-a-b-z}Ba_aCa_bM''_cEu_z)SiO_5 \cdot xSE_2SiO_5,$$

where $M''$=Mg, Cu, Zn and/or Mn, and
SE=Y, La, Gd and/or Lu and/or another element selected from the group consisting of the lanthanoids with the atomic numbers 58 to 71,
and the molar proportions
$x \leq 0.2$, in particular $x \leq 0.1$,
$0 \leq a \leq 3$, $0 \leq b \leq 0.05$, $0 \leq c \leq 0.5$
and $z \leq 0.25$.

According to exemplary embodiments of the invention, alkaline earth metal and rare earth metal oxyorthosilicates can form, within certain concentration limits, solid solutions, the crystalline mixed phases, with one another, and the $Eu^{2+}$ activation of such base lattices can lead to efficient luminescent substances having substantially improved moisture stability. The concentration range for the solid solution formation may be up to 15 mol % of rare earth metal oxyorthosilicate.

On excitation with high-energy radiation, the luminescent substances according to the invention emit in the visible part of the spectrum, preferably in the range between 560 nm and 620 nm, depending on their specific chemical composition. The excitability of the $Eu^{2+}$ luminescence may extend from 220 nm in the UV range up to 550 nm in the visible range, which means that the inventive luminophores can be excited even with green excitation radiation to give an efficient yellow to orange or red luminescence.

The preparation of the luminescent substances can be effected based on multistage high-temperature solid-state reactions occurred between the alkaline earth metal and rare earth metal carbonates preferably used as starting material or the corresponding oxides and colloidal $SiO_2$, it may be possible to add certain amounts of fluxes or mineralization additives, for example, $NH_4Cl$, certain alkali metal or alkaline earth metal fluorides to the reaction mixture to promote the reactivity and to control the particle size distribution of the resulting luminophores. These starting materials may thoroughly be mixed and then ignited for 1 to 48 hours at temperatures of 1300 to 1700° C. in an inert or reducing atmosphere. The main ignition process for the purpose of optimizing the properties of the luminescent substances can optionally have a plurality of ignition stages in different temperature ranges. After the end of the ignition process, the samples can be cooled to room temperature and subjected to suitable post-treatment processes which design, for example, for the elimination of flux residues, the minimization of surface defects or the fine adjustment of the particle size distribution.

Instead of the colloidal silica, silicon nitride ($Si_3N_4$) can also alternatively be used as a reactant for the reaction with the alkaline earth metal and rare earth metal compounds may be used. It is also possible to prepare the respective individual alkaline earth metal or rare earth metal oxyorthosilicate components separately from one another and then to ensure the solid solution formation by repeated thermal treatment in a temperature range suitable for the purpose.

Detailed information of the preparation of the luminescent substances can be described below with reference to a plurality of working examples.

EXAMPLE 1

Example 1 describes a preparation of a strontium oxyorthosilicate luminescent substance having the composition $(Sr_{2.95}Ba_{0.01}Eu_{0.04})SiO_5$, which is regarded as reference material for evaluating the advantages of the inventive luminescent substances.

For the preparation of luminescent substance, approximately 217.75 g of $SrCO_3$, 0.99 g of $BaCO_3$, 3.52 g of $Eu_2O_3$ and 31.54 g of $SiO_2$ and 2.68 g of $NH_4Cl$ can be thoroughly mixed and then ignited for about 4 hours at a temperature of approximately 1350° C. in a forming gas atmosphere. After the end of the ignition process, the ignited material can be homogenized by milling and then subjected again to a thermal treatment at approximately 1350° C. for about two hours in reducing $N_2/H_2$ atmosphere having a hydrogen concentration of at least about 5%. The aftertreatment of the cooled ignited material may include the milling thereof, the carrying out of washing processes and the drying and sieving of the end products.

EXAMPLE 2

Example 2 describes the synthesis of the luminescent substance having the composition $0.99.(Sr_{2.95}Ba_{0.01}Eu_{0.04})SiO_5 \cdot 0.01 \cdot Y_2SiO_5$. This luminescent substance can be prepared while maintaining the ignition conditions described in Example 1, the following starting materials and amounts can be used: 215.58 g of $SrCO_3$, 0.98 g of $BaCO_3$, 1.13 g of $Y_2O_3$, 3.47 g of $Eu_2O_3$, 31.54 g of $SiO_2$ and 2.68 g of $NH_4Cl$.

EXAMPLE 3

In the preparation of the luminescent substance having the composition $0.95.(Sr_{2.8875}Ba_{0.01}Cu_{0.0025}Eu_{0.10})SiO_5 \cdot 0.05 \cdot Gd_2SiO_5$, 202.48 g of $SrCO_3$, 0.94 g of $BaCO_3$, 0.094 g of $CuO$, 9.06 g of $Gd_2O_3$, 8.36 g of $Eu_2O_3$ and 30.94 g of $SiO_2$ can be used as starting materials in Example 3, to which 4.0 g of $NH_4Cl$ can be added as a flux. After thorough homogenization, the starting mixture can be transferred to corundum crucibles, which can be positioned in a high-temperature furnace. In this example, the solid mixtures may be subjected to an ignition regime which has a first 10 hour holding stage at approximately 1200° C., a second 5 hour holding stage at approximately 1550° C. and a third holding stage at approximately 1350° C., the residence time in the last stage being 2 hours. The ignitions are effected in pure nitrogen until approximately 1550° C. ramp has been reached, in an $N_2/H_2$ mixture with 20% hydrogen during the approximately 1550° C. phase and then in forming gas (5% hydrogen), cooling being effected by the greatest possible speed after the end of the approximately 1350° C. ignition stage. The aftertreatment of the samples of the luminescent substance can be effected in the manner described in Example 1.

EXAMPLE 4

Preparation variant according to Example 4 comprises preparing the modified strontium oxyorthosilicates and the rare earth metal oxyorthosilicates separately from one another and then apply the solid solution formation in a separate production step. The resulting luminescent substance has the composition $0.995.(Sr_{2.498}Ba_{0.45}Ca_{0.002}Eu_{0.05})SiO_5.0.005.La_2SiO_5$.

The synthesis of the $(Sr_{2.498}Ba_{0.45}Ca_{0.002}Eu_{0.05})SiO_5$ component can be applied analogously to Example 1 by utilizing the following amounts: 184.39 g of $SrCO_3$, 44.40 g of $BaCO_3$, 0.078 g of $CaF_2$, 3.96 g of $Eu_2O_3$ and 31.54 g of $SiO_2$. The required lanthanum oxyorthosilicate $La_2SiO_5$ can be prepared in a one-stage ignition process with the use of 325.81 g of $La_2O_3$, 55.2 g of $SiO_2$ and 2.68 g of $NH_4Cl$, then the thoroughly mixed starting materials is ignited for about 6 hours at temperatures of approximately 1380° C. in forming gas.

For the production of the luminescent substance in its composition, 197.23 g of the prepared $(Sr_{2.498}Ba_{0.45}Ca_{0.002}Eu_{0.05})SiO_5$ component and 0.96 g of $La_2SiO_5$ may be subjected to a thorough mixing procedure and then heated for about 6 hours at approximately 1150° C. in a nitrogen-hydrogen (5%) stream.

Figure 6:
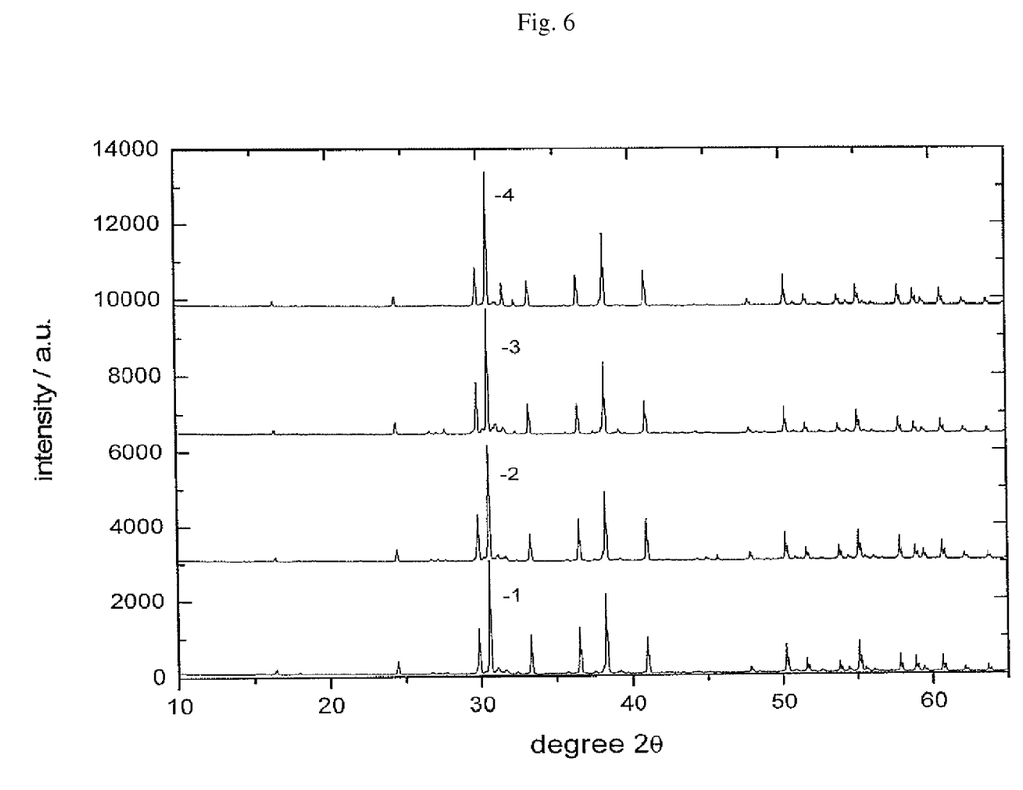
FIG. 6 is a graph showing the X-ray diffraction diagrams of different luminescent substances.

FIG. 6 is a graph showing the X-ray diffraction diagrams of luminescent substances whose preparations are described in Working Examples 1 through 4. It should be understood that the reflections of $Sr_3SiO_5$ are known from the literature, the diffraction angles can be shifted slightly compared with the pure $Sr_3SiO_5$ phase due to the lattice substitutions being carried out. Indications of the presence of reflections which could be assigned to the monoclinic $SE_2SiO_5$ phases may not detectable in any of the diagrams. Such reflections actually may occur only on the outside of the stated concentration limits for the formation of solid solutions between the strontium oxyorthosilicate and the corresponding rare earth metal oxyorthosilicates.

TABLE 1

| Material | Lattice constants | |
|---|---|---|
| | a = b | c |
| Commercially available $Sr_3SiO_5$: Eu | 6.962 | 10.771 |
| $(Sr_{2.95}Ba_{0.01}Eu_{0.04})SiO_5$-reference | 6.957 | 10.770 |
| 0.99 $(Sr_{2.95}Ba_{0.01}Eu_{0.04})SiO_5$—0.01 $Y_2SiO_5$ | 6.955 | 10.769 |
| 0.975 $(Sr_{2.95}Ba_{0.01}Eu_{0.04})SiO_5$—0.025 $Y_2SiO_5$ | 6.958 | 10.770 |
| 0.95 $(Sr_{2.95}Ba_{0.01}Eu_{0.04})SiO_5$—0.05 $Y_2SiO_5$ | 6.954 | 10.766 |
| 0.98 $(Sr_{2.95}Ba_{0.01}Eu_{0.04})SiO_5$—0.02 $Gd_2SiO_5$ | 6.957 | 10.770 |
| 0.95 $(Sr_{2.95}Ba_{0.01}Eu_{0.04})SiO_5$—0.05 $Gd_2SiO_5$ | 6.958 | 10.773 |
| 0.925 $(Sr_{2.95}Ba_{0.01}Eu_{0.04})SiO_5$—0.075 $Gd_2SiO_5$ | 6.956 | 10.769 |
| 0.995 $(Sr_{2.95}Ba_{0.01}Eu_{0.04})SiO_5$—0.005 $La_2SiO_5$ | 6.954 | 10.767 |
| 0.99 $(Sr_{2.95}Ba_{0.01}Eu_{0.04})SiO_5$—0.01 $La_2SiO_5$ | 6.957 | 10.768 |
| 0.975 $(Sr_{2.95}Ba_{0.01}Eu_{0.04})SiO_5$—0.025 $La_2SiO_5$ | 6.957 | 10.769 |

TABLE. 1 enumerates the lattice constants of further luminescent substances according to exemplary embodiments of the invention which can be prepared analogously to the method stated in Example 2. The lattice constants of the luminophores are very similar to one another. In view of the comparatively small proportions of $SE_2SiO_5$ in the oxyorthosilicate solid solutions used as base lattices of the luminescent substances, no clear trends can be detectable for the variation of the lattice constants.

In TABLE. 2, indications of solid solution formation between the differing oxyorthosilicate lattices are evident from the listed luminescence parameters of the luminescent substances according to exemplary embodiments of the invention. For example, the systematic shifts of the color coordinates and of the full widths at half maximum of the emissions spectra, which can be registered with an increase of proportion of $SE_2SiO_5$, are a safe indication of the formation of solid solutions. Differences may occur when incorporation of yttrium oxyorthosilicate or gadolinium oxyorthosilicate on the one hand and lanthanum oxyorthosilicate on the other hand. The difference may inevitable due to the differences in the ionic radii of the respective rare earth elements.

The luminescence efficiencies of the inventive luminescent substances and the temperature dependencies thereof show improvements compared with the known $Sr_3SiO_5$:Eu luminescent substances.

TABLE 2

| Material | Powder Intensity 450 nm excitation % | Color coordinates | | FWHM nm | Intensity 150° C. % |
|---|---|---|---|---|---|
| | | x value | y value | | |
| Commercially available $Sr_3SiO_5$: Eu | 98.3 | | | | 91.3 |
| $(Sr_{2.95}Ba_{0.01}Eu_{0.04})SiO_5$-reference | 100 | 0.5373 | 0.4604 | 68.4 | 91.5 |
| 0.99 $(Sr_{2.95}Ba_{0.01}Eu_{0.04})SiO_5$—0.01 $Y_2SiO_5$ | 99.6 | 0.5371 | 0.4604 | 69.5 | 91.4 |
| 0.975 $(Sr_{2.95}Ba_{0.01}Eu_{0.04})SiO_5$—0.025 $Y_2SiO_5$ | 100.8 | 0.5362 | 0.4611 | 70.5 | 92.5 |
| 0.95 $(Sr_{2.95}Ba_{0.01}Eu_{0.04})SiO_5$—0.05 $Y_2SiO_5$ | 98.7 | 0.5343 | 0.4629 | 70.9 | 92.1 |
| 0.98 $(Sr_{2.95}Ba_{0.01}Eu_{0.04})SiO_5$—0.02 $Gd_2SiO_5$ | 101.3 | 0.5361 | 0.4614 | 70.1 | 93.2 |
| 0.95 $(Sr_{2.95}Ba_{0.01}Eu_{0.04})SiO_5$—0.05 $Gd_2SiO_5$ | 100.2 | 0.5358 | 0.4615 | 71.3 | 91.4 |
| 0.925 $(Sr_{2.95}Ba_{0.01}Eu_{0.04})SiO_5$—0.075 $Gd_2SiO_5$ | 97.9 | 0.5346 | 0.4625 | 72.7 | 92.0 |
| 0.995 $(Sr_{2.95}Ba_{0.01}Eu_{0.04})SiO_5$—0.005 $La_2SiO_5$ | 102.0 | 0.5377 | 0.4602 | 68.5 | 87.6 |
| 0.99 $(Sr_{2.95}Ba_{0.01}Eu_{0.04})SiO_5$—0.01 $La_2SiO_5$ | 102.5 | 0.5382 | 0.4596 | 68 | 87.2 |
| 0.975 $(Sr_{2.95}Ba_{0.01}Eu_{0.04})SiO_5$—0.025 $La_2SiO_5$ | 99.2 | 0.5352 | 0.4624 | 67.9 | 87 |

Figure 7:
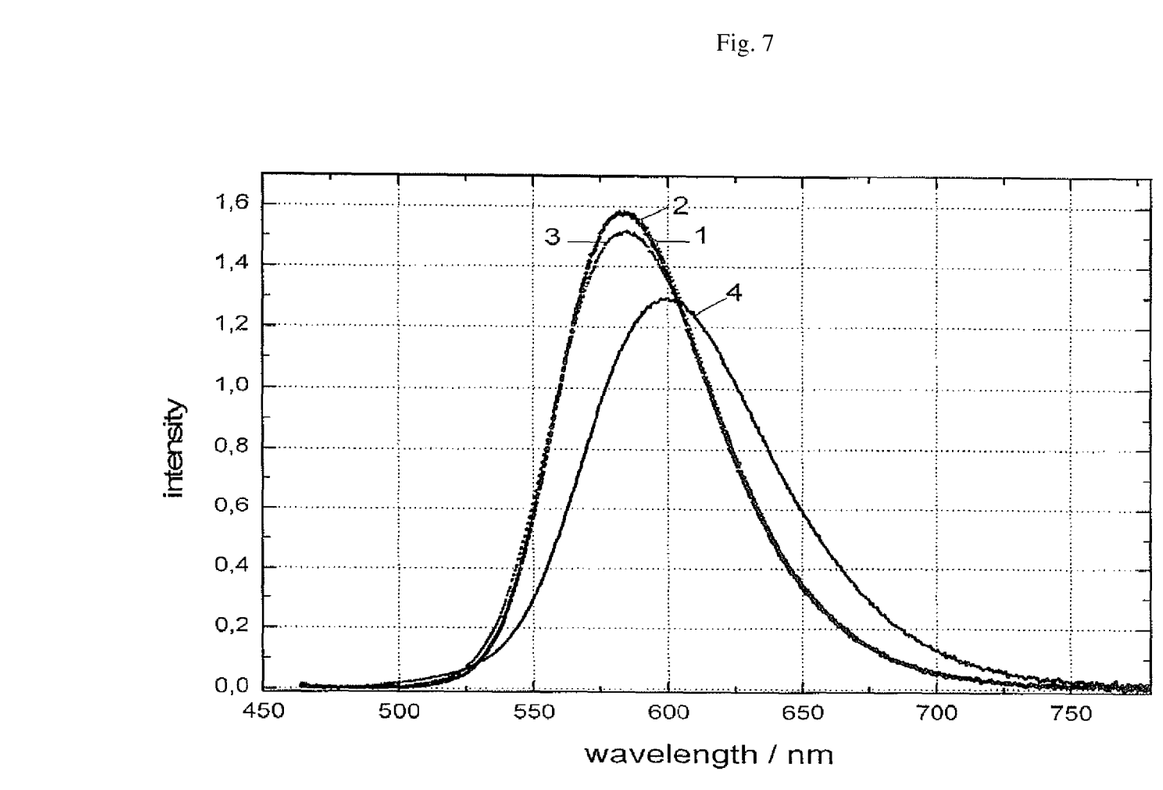
FIG. 7 is a graph showing the emission spectra of inventive luminescent substances of different composition.

The results listed in TABLE. 2 show that, according to preparation methods, the luminescent substances can be prepared with comparable or somewhat higher luminescence efficiencies. In FIG. 7, the emissions spectra of the luminescent substances according to exemplary embodiments of the invention, of Examples 1 through 4, are shown together.

For assessing the moisture stability of the materials, the corresponding samples of luminescent substances can be stored for a period of 7 days at a temperature of 85° C. and 85% relative humidity in a conditioned chamber. Thereafter, the luminophores can be dried at 150° C. and then subjected to a comparative measurement of the luminescence efficiency. Exemplary results of such investigations are listed in TABLE. 3.

TABLE 3

| Material | Powder Intensity 450 nm excitation % | Intensity 150° C. % | Intensity after moistening test % |
|---|---|---|---|
| Commercially available $Sr_3SiO_5$: Eu | 98.3 | 91.3 | 69.3 |
| $(Sr_{2.95}Ba_{0.01}Eu_{0.04})SiO_5$-reference | 100 | 91.6 | 72.0 |
| 0.99 $(Sr_{2.95}Ba_{0.01}Eu_{0.04})SiO_5$—0.01 $Y_2SiO_5$ | 99.6 | 91.4 | 93.6 |
| 0.975 $(Sr_{2.95}Ba_{0.01}Eu_{0.04})SiO_5$—0.025 $Y_2SiO_5$ | 100.8 | 92.5 | 95.1 |
| 0.95 $(Sr_{2.95}Ba_{0.01}Eu_{0.04})SiO_5$—0.05 $Y_2SiO_5$ | 98.7 | 92.1 | 91.3 |
| 0.98 $(Sr_{2.95}Ba_{0.01}Eu_{0.04})SiO_5$—0.02 $Gd_2SiO_5$ | 101.3 | 93.2 | 89.7 |
| 0.95 $(Sr_{2.95}Ba_{0.01}Eu_{0.04})SiO_5$—0.05 $Gd_2SiO_5$ | 100.2 | 91.4 | 94.2 |
| 0.925 $(Sr_{2.95}Ba_{0.01}Eu_{0.04})SiO_5$—0.075 $Gd_2SiO_5$ | 97.9 | 92.0 | 95.3 |
| 0.995 $(Sr_{2.95}Ba_{0.01}Eu_{0.04})SiO_5$—0.005 $La_2SiO_5$ | 102.0 | 87.6 | 90.3 |
| 0.99 $(Sr_{2.95}Ba_{0.01}Eu_{0.04})SiO_5$—0.01 $La_2SiO_5$ | 102.5 | 87.2 | 88.8 |
| 0.975 $(Sr_{2.95}Ba_{0.01}Eu_{0.04})SiO_5$—0.025 $La_2SiO_5$ | 99.2 | 87 | 86.4 |

From the data shown, it is understood that both the conventional luminescent substances of the structure $Sr_3SiO_5$:Eu and the $(Sr_{2.95}Ba_{0.01}Eu_{0.04})SiO_5$ luminescent substances prepared for reference purposes have only about 70% of their original luminescence efficiency after completion of the moistening procedure. In comparison, inventive europium-doped oxyorthosilicate luminescent substances having mixed-phased base lattices comprising alkaline earth metal oxyorthosilicates and rare earth metal oxyorthosilicates have substantially improved moisture resistances. After storage in an 85° C./85% H atmosphere for seven days, luminescence efficiencies of >90%, in the case of optimized samples of >95%, can still be achieved.

According to exemplary embodiments of the invention a light emitting device comprising a light emitting diode to emit light of ultraviolet or visible light is disclosed. Luminescent substances can be disposed around the light emitting diode to absorb at least a portion of the light emitted from the light emitting diode and emitting light having a different wavelength from the absorbed light. Further, the light emitting device may use solid solutions, referred to as mixed phases, between the alkaline earth metal oxyorthosilicates and rare earth metal oxyorthosilicates where oxyorthosilicate luminescent substances can be formed as base lattices for the $Eu^{2+}$ activation leading to luminescence. Such a solid solution formation may lead to stabilization of the solid-state matrix and to substantially improve resistance of the corresponding luminophores to atmospheric humidity and other environmental factors. In this example, the longevity of the inventive luminescent substances and that of the light-emitting arrangement produced therefrom can be permanently improved.

The luminescent substances according to the invention can be provided by the following formula:

$$(1-x)M^{II}_3SiO_5 \cdot xSE_2SiO_5:Eu.$$

This group of luminescent substances comprises $Eu^{2+}$-doped silicate luminophores for which solid solutions, referred to as mixed phases, between alkaline earth metal oxyorthosilicates and rare earth metal oxyorthosilicates can be used as base lattices. The solid solution formation, between the two different oxyorthosilicate types which is possible within certain concentration limits, has been detected that can be characterized by the following notation:

$$(1-x)M^{II}_3SiO_5 \cdot xSE_2SlO_5.$$

In a conventional structural formula, $M^{II}$ preferably represents the alkaline earth metal ion of Sr or represents another alkaline earth metal ion or another divalent metal ion selected from the group consisting of the elements magnesium, calcium, barium, copper, zinc and manganese, and these ions can be used in defined amounts, in addition to the strontium and also as mixtures with one another. In a barium case, complete replacement of the strontium can be possible. The proportion of the other divalent metal ions incorporated in addition to the strontium may be up to about 0.5.

The symbol SE used in the general formula can represent rare earth metals and designate the trivalent metal ions of yttrium, lanthanum and lanthanoids, i.e., —elements having atomic numbers 58 to 71, but preferably the corresponding ions of the elements yttrium, lanthanum, gadolinium and lutetium. These ions can be incorporated either as individual components or as mixtures with one another into the matrix.

Apart from europium and in addition to this doping element, in principle further divalent rare earth metal ions, such as, for example, those of samarium, ytterbium or certain trivalent rare earth metal ions, for example, cerium ions ($Ce^{3+}$) can also be used in principle as activators.

For the purpose of optimizing the luminescence properties and the stability behaviour, even further modifications are possible in the case of the composition of the luminescent substances according to exemplary embodiments of the invention. Thus, for example, the silicon can be replaced by germanium and/or by aluminum, gallium, boron or phosphorus, it is noted, however, taking suitable measures is necessary for preserving the charge balance in the last mentioned cases. These may further incorporate, for example, monovalent cations, lithium, sodium or potassium, or anions, for example, fluorine, chlorine, bromine or iodine into the base lattices according to the invention.

According to exemplary embodiments, the luminescent substances have a following formula:

$$(1-x)(Sr_{3-a-b-z}Ba_aCa_bM^{II}_cEu_z)SiO_5 \cdot xSE_2SiO_5,$$

where $M^{II}$=Mg, Cu, Zn and/or Mn, and

SE=Y, La, Gd and/or Lu and/or another element selected from the group consisting of the lanthanoids with the atomic numbers 58 to 71, and the molar proportions
x≦0.2, in particular x≦0.1,
0≦a≦3, 0≦b≦0.05, 0≦c≦0.5
and z≦0.25.

Alkaline earth metal oxyorthosilicates and rare earth metal oxyorthosilicates not only differ from one another with regard to the nature and the charge of the respective cations but also have substantially different crystal structures. The reason for the different characteristics is that the alkaline earth metal compounds form tetragonal lattices having space group P4/ncc, whereas the rare earth metal oxyorthosilicates crystallize in the monoclinic system with the space groups P2/c and B2/b, respectively.

Both classes of compounds are suitable host lattices for doping with rare earth metal activators. The alkaline earth metal oxyorthosilicates are, as described, preferably doped with divalent ions, i.e., for example, with $Eu^{2+}$ ions, whereas of course in particular trivalent rare earth metal ions, i.e., for example, $Eu^{3+}$ or $Ce^{3+}$ activators, can be incorporated into the rare earth metal oxyorthosilicate base lattices. In this context, the luminescent substance $Y_2SiO_5$:Ce can be mentioned by way of example as a representative of this class of luminescent substance and can emit in the blue range of the visible spectrum in an extremely effective manner on excitation with ionizing or UV radiation and can therefore be used in X-ray detectors, in electron beam tubes or PDP displays.

According to exemplary embodiments of the invention, alkaline earth metal and rare earth metal oxyorthosilicates may form, within certain concentration limits, solid solutions, the crystalline mixed phases, with one another, and the $Eu^{2+}$ activation of such base lattices leads to efficient luminescent substances having substantially improved moisture stability. The concentration range for the solid solution formation may be up to about 15 mol % of rare earth metal oxyorthosilicate.

On excitation with high-energy radiation, the luminescent substances may emit in the visible part of the spectrum, preferably in the range between approximately 560 and approximately 620 nm, depending on their specific chemical composition. The excitability of the $Eu^{2+}$ luminescence may extend from approximately 220 nm in the UV range up to approximately 550 nm in the visible range, which means that the inventive luminophores can be excited even with green excitation radiation to give an efficient yellow to orange or red luminescence. Intensive and technically usable luminescence processes may occur even on irradiation of the luminescent substances with electron beams, X-ray beams or gamma radiation. Due to their luminescence properties, the luminescent substances can be used as radiation converters to convert ionizing gamma radiation or X-ray or electron beams, ultraviolet, blue or green radiation into longer-wave, visible light, that can preferably be emitted in the yellow, orange or red spectral range. They can be used in a multiplicity of technical devices, for example, in cathode ray tubes and other image-generating systems (e.g., scanning laser beam systems), in X-ray image converters, in fluorescent lamps, LEDs emitting colored and white light, in solar cells or greenhouse sheets and glasses as radiation converters alone or in combination with other luminescent substances emitting blue, green, yellow and/or red lights.

The light emitting device may implement white light or desired light of color in combination of light emitted from the light emitting diode and light emitted from the luminescent substances. For example, white light or desired light of color may be implemented by mixing light emitted from the light emitting diode and light emitted from the luminescent substances. Furthermore, other luminescent substances may be added to implement desired light of color.

The luminescent substances may be disposed on at least one of side, top or bottom faces of the light emitting diode. Further, the luminophores may be mixed into an adhesive or a molding member so that the luminophores can be disposed around the light emitting diode.

The light emitting diode and the luminescent substances may be formed within one package. In addition, other light emitting diode may be formed within the package. The other light emitting diode may emit light of the same wavelength or a different wavelength from that of the above light emitting diode. For example, the other light emitting diode may emit light of longer wavelength than the emission peak wavelength of the luminescent substances.

The package may include a substrate comprising a printed circuit board and a lead frame on which the light emitting diode is mounted. In addition, the package may further comprise a reflector reflecting light emitted from the light emitting diode. In this example, the light emitting diode can be mounted in the reflector.

Moreover, the light emitting device may further comprise a molding member to encapsulate the light emitting diode on the substrate. The luminescent substances may be distributed in the molding member, but not limited thereto.

Further, the package may comprise a heat-sink, and the light emitting diode may be mounted on the heat-sink.

In various embodiments of the present invention, the light emitting diode may be formed of (Al,Ga,In)N based composite semiconductor.

The light emitting diode may have, for example, a double heterostructure which has a single active region, single quantum well structure or multiquantum well structure disposed between n-type and p-type semiconductor layers.

The light emitting diode may comprise a plurality of light emitting cells spaced apart from one another on a single substrate. Each of the light emitting cells comprises an active region, and these light emitting cells may be connected to one another in series and/or in parallel through wires so that the light emitting cells can be directly driven under AC power supply. Such an AC-light emitting diode can be driven in connection to AC power supply without outer AC-DC converter by forming a bridge rectifier and a series array of light emitting cells connected to the rectifier, or by forming series arrays of light emitting cells on a single substrate, these arrays being electrically connected to each other in anti-parallel.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:
1. A light emitting device comprising;
a light emitting diode; and
luminescent substances disposed around the light emitting diode to adsorb at least a portion of light emitted from the light emitting diode, the light having different wavelength from that of the absorbed light, wherein the luminescent substances comprise $Eu^{2+}$-doped silicate luminophores comprising solid solutions comprising mixed phases between alkaline earth metal oxyorthosilicates and rare earth metal oxyorthosilicates used as base lattices for the $Eu^{2+}$ activation leading to luminescence.

2. The light emitting device of claim 1, wherein the $Eu^{2+}$-doped silicate luminophores are provided according to a formula $(1-x)M^{II}{}_3SiO_5 \cdot x\ SE_2SiO_5{:}Eu$, wherein, the $M^{II}$ represents divalent metal ions comprising at least one selected from a group consisting of strontium ion and barium ion and SE represents rare earth metals, and wherein $0 \leqq x \leqq 0.5$.

3. The light emitting device of claim 2, wherein the $M^{II}$ comprises at least one divalent metal ion selected from a group consisting of Mg, Ca, Cu, Zn and Mn.

4. The light emitting device of claim 3, wherein the proportion of the at least one divalent metal ion selected from the group consisting of Mg, Ca, Cu, Zn and Mn is less than or same to about 0.5.

5. The light emitting device of claim 2, wherein the rare earth metals comprise at least one trivalent metal ion selected from a group consisting of Y, La and lanthanides with atomic numbers 58 to 71.

6. The light emitting device of claim 2, wherein the rare earth metals comprise at least one trivalent metal ion selected from a group consisting of Y, La, and Gd.

7. The light emitting device of claim 1, wherein the luminophores comprise a divalent rare earth metal ion and a trivalent rare earth metal ion as activators in addition to Eu.

8. The light emitting device of claim 7, wherein the divalent rare earth metal ion activators are samarium ions or ytterbium ions.

9. The light emitting device of claim 7, wherein the trivalent rare earth metal ion activators are cerium ions ($Ce^{3+}$).

10. The light emitting device of claim 1, wherein the luminophores are provided according to a formula $(1-x)(Sr_{3-a-b-z}Ba_aCa_bM^{II}{}_cEu_z)SiO_5 \cdot x\ SE_2SiO_5$, wherein the $M^{II}$ is at least one selected from a group consisting of Mg, Cu, Zn and Mn, SE is an element selected from a group consisting of Y, La and lanthanides with atomic numbers 58 to 71, $0 \leqq x \leqq 0.2$, $0 \leqq a \leqq 3$, $0 \leqq b \leqq 0.05$, $0 \leqq c \leqq 0.05$, and $z \leqq 0.25$.

11. The light emitting device of claim 10, wherein $0 < x \leqq 0.1$.

12. The light emitting device of claim 1, wherein the light emitting device is configured to emit white light by mixing light emitted from the light emitting diode and light emitted from the luminescent substances.

13. The light emitting device of claim 1, wherein the luminescent substances have a peak wavelength between approximately 560 nm and approximately 620 nm.

14. The light emitting device of claim 1, wherein the light emitting diode and the luminescent substances are formed within one package.

15. The light emitting device of claim 14, further comprising:

a light emitting diode formed within the package, wherein the light emitting diode emits light of longer wavelength than the emission peak wavelength of the luminescent substances.

16. The light emitting device of claim 14, wherein the package comprises a substrate on which the light emitting diode is mounted.

17. The light emitting device of claim 16, wherein the substrate comprises a printed circuit board and a lead frame.

18. The light emitting device of claim 17, further comprising:

a molding member to encapsulate the light emitting diode on the substrate, wherein the luminescent substances are distributed in the molding member.

19. The light emitting device of claim 14, wherein the package comprises a heat-sink on which the light emitting diode is mounted.

20. The light emitting device of claim 1, wherein the light emitting diode comprises a plurality of light emitting cells.

\* \* \* \* \*